United States Patent [19]

Freyman

[11] 4,360,742

[45] Nov. 23, 1982

[54] SYNCHRONOUS BINARY-COUNTER AND PROGRAMMABLE RATE DIVIDER CIRCUIT

[75] Inventor: Ronald L. Freyman, Bethlehem, Pa.

[73] Assignee: Bell Telephone Laboratories, Incorporated, Murray Hill, N.J.

[21] Appl. No.: 175,054

[22] Filed: Aug. 4, 1980

[51] Int. Cl.³ .................... H03K 21/36; H03K 21/34; H03K 23/22

[52] U.S. Cl. .................... 307/224 C; 235/92 DM; 235/92 PE; 328/51; 328/49

[58] Field of Search .................... 307/224 R, 224 C; 328/49, 51; 235/92 DM, 92 GT, 92 PE

[56] References Cited

U.S. PATENT DOCUMENTS

| | | | |
|---|---|---|---|
| 3,593,032 | 7/1971 | Ma | 307/224 C |
| 3,943,378 | 3/1976 | Beutler | 307/224 C |
| 4,214,173 | 7/1980 | Popper | 307/224 X |
| 4,297,591 | 10/1981 | Roesler et al. | 307/224 C |

*Primary Examiner*—John S. Heyman
*Attorney, Agent, or Firm*—Arthur J. Torsiglieri

[57] ABSTRACT

An MOS parallel carry synchronous binary counter/-clock rate divider circuit has a chain of simultaneously clocked T flip-flop interconnected by an improved enable logic circuit having a plurality of identical carry stages each associated with a different flip-flop except the first and last flip-flop of the chain. Each carry stage has an input terminal connected to the inverted enable input of its associated flip-flop, an output terminal connected to the inverted enable input of the next flip-flop in the chain, a transmission gate transistor having a conduction channel connected in series between the input and output terminals and a gate connected to the normal output of the associated flip-flop, and a depletion mode load transistor having a conduction channel connected between a VDD power supply terminal and the output terminal and a gate connected to the output terminal. The carry stage associated with the first flip-flop comprises an inverter having an input connected to the normal output of the first flip-flop and an output connected to the inverted enable input of the second flip-flop. The clock rate division signal provided by the output of the last flip-flop in the chain can be made programmable by including a programming network in each carry stage. The programming network comprises one or more transistors having conduction channels coupled in series between the output terminal and ground and having gates responsive to control signals for forcing a logic "0" level on the output terminal.

4 Claims, 4 Drawing Figures

SYNCHRONOUS BINARY-COUNTER AND PROGRAMMABLE RATE DIVIDER CIRCUIT

BACKGROUND OF THE INVENTION

This invention relates to electronic digital counter circuits and more particularly to parallel-carry synchronous, binary counter and programmable clock rate divider circuits implemented with field effect transistors (FETs).

Synchronous binary counters of the type having a chain of simultaneously clocked flip-flop stages interconnected with a parallel enable logic circuit are well known in the art for having the advantage of fast response from the time a clock pulse is applied until all flip-flops reach the next state, and of substantially simultaneous state transitions of the flip-flop stages. Such circuits are also useful as clock rate dividers since the output signal from each stage of the counter changes state at a rate which is equal to the clock rate divided by two taken to some integral power. Typical prior art synchronous counter circuits employ a T-type flip-flop in each stage. A T-type flip-flop is one having an enable input which, if held at a predetermined logic level, causes the flip-flop to "toggle," i.e., to have its logic state complemented after each clock pulse. In prior art parallel carry synchronous counters the enable logic circuit which provides the signals to the enable inputs of each T-type flip-flop generally comprise a plurality of AND gates or NOR gates, each associated with a different flip-flop. The enable input of a given flip-flop receives the output from its associated AND gate or NOR gate which in turn receives the outputs from all previous flip-flop in the chain. Consequently, those gates which are associated with flip-flops near the end of the chain have a large number of inputs, or a high "fan-in", and the outputs of those flip-flops near the beginning of the chain have outputs connected to a large number of gates, or a high "fan-out". The maximum fan-in of the logic gates and the maximum fan-out of the flip-flops in a counter increase with the number of stages in the counter. In general, logic circuits with high fan-in or high fan-out have slow operating speeds.

Therefore, owing to the presence of high fan-in gates and high fan-out flip-flops, prior art parallel carry synchronous binary counter circuits have the deficiency in that the maximum clock rates of such circuits decrease rapidly as the number of counter stages is increased.

Another deficiency of the prior art circuits is that they occupy a large area when incorporated in an integrated circuit chip and, therefore, are costly to implement. The large layout areas of prior art circuits are needed to accommodate the numerous transistors in the enable logic circuits with their high fan-in gates and the numerous interconnections from the high fan-out flip-flops. Moreover, unlike asynchronous ripple counters which can have identical stages, prior art synchronous counter circuits do not have the advantage of a simple and compact modular layout on an integrated circuit chip derived from having identical stages.

A prior art solution to the problems of high fan-in gates, high fan-out flip-flops and large layout area in prior art synchronous, binary counters is to utilize a chain-type enable circuit for propagating a logic "1" carry signal as disclosed in U.S. Pat. No. 4,214,173 by J. Popper. The enable circuit in Popper uses an insulated-gate field-effect transistor (IGFET) transmission gate having its conduction channel connected between the enable terminals of successive ones of the flip-flops of the counter stages and its gate connected to the Q output of the flip-flop of the preceding stage. Thus, when the flip-flop of the preceding stage is in the logic "1" state the enable signal which is applied to the enable terminal of that flip-flop is passed to the enable terminal of the flip-flop of the next succeeding stage. When the flip-flop of the preceding stage is in the logic "0" state, the enable signal applied to that flip-flop is blocked from passing to the flip-flops of succeeding stages. However, such prior art chain-type enable circuit is deficient in that an enable signal having a full logic "1" level of $V_{DD}$ is reduced after passing through an IGFET transmission gate to have a maximum level of $V_{DD}-V_{TH}$, where $V_{TH}$ is the threshold voltage of the IGFET of the transmission gate. This loss in the enable signal level reduces the current passing capabilities of succeeding transmission gates and results in a slower propagation time for the enable signal than would be the case if the level of the enable signal were not reduced.

Therefore, a need clearly exists for a parallel-carry synchronous, binary counter having an improved chain-type enable circuit which provides faster enable signal propagation.

SUMMARY OF THE INVENTION

Accordingly, the above and other deficiencies of the prior art are improved by the present invention which is a synchronous counter/divider circuit comprising a plurality of ordered flip-flop stages including a first, second and last stage. Each flip-flop stage has output means for providing an output signal representing the logic state of the flip-flop stage and clock input means for receiving clock pulses. Each flip-flop stage except the first one has enable means and being enabled to toggle when an enable signal at a first logic level is applied to the enable means, the first flip-flop stage being adapted to toggle. The counter/divider circuit also comprises means for applying a sequence of clock pulses to the clock input means of each flip-flop stage and logic means responsive to the output signal from each flip-flop stage for providing an enable signal to the enable means of selected ones of the flip-flop stages according to a predetermined logic function. The counter/divider circuit is characterized in that the logic means comprises a plurality of carry stages a different one associated with each of the flip-flop stages except the last one. Each carry stage except the one associated with the first flip-flop stage comprises an input terminal coupled to the enable means of the associated flip-flop stage, an output terminal coupled to the enable means of the succeeding flip-flop stage, load means coupled between the output terminal and a first terminal, the first terminal being adapted to be coupled to a first source of potential and transmission gate means having a conduction path coupled in series between the input terminal and the output terminal and a control terminal for controlling the resistance of the path and coupled to the output means of the associated flip-flop stage. The carry stage associated with the first flip-flop stage comprises inverter means for complementing the output signal from the first flip-flop stage and for providing the complemented output signal to the enable means of the second flip-flop stage.

DETAILED DESCRIPTION

Figure 1:
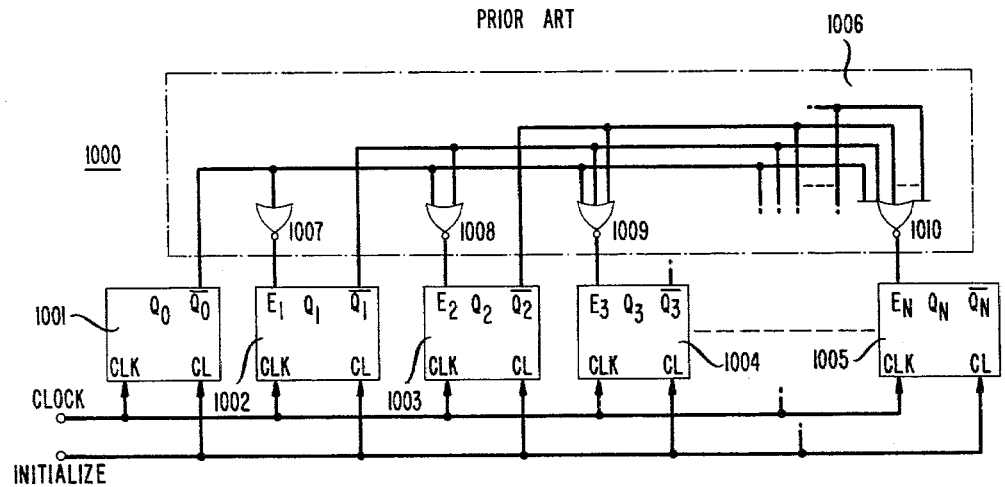
FIG. 1 is a schematic diagram of a typical prior art parallel carry synchronous counter circuit also useful as a clock rate divider.

Referring now to FIG. 1 there is shown a parallel carry synchronous binary counter circuit known in the prior art. The circuit contains a chain of N flip-flop stages 1001 through 1005 which are all triggered simultaneously by clock pulses applied to the CLOCK terminal and are arranged along the chain according to the order of significance of the bit stored in each flip-flop. Thus, the first flip-flop 1001 stores the least significant bit while the last flip-flop 1005 stores the most significant bit. Each flip-flop has a normal output terminal Q for providing the logic state of the flip-flop, and an inverted output terminal $\overline{Q}$ for providing the complement of the logic state. Each flip-flop also has an enable input terminal E (except the first flip-flop), a clock input terminal CLK, and an asynchronous clear input terminal CL. When a logic "1" signal is applied to the E input of a selected flip-flop, it becomes enabled to "toggle" in that its outputs Q and $\overline{Q}$ are complemented after each clock pulse. However, when a logic "0" is applied to E input of a selected flip-flop it becomes disabled in that its outputs Q and $\overline{Q}$ remain unchanged after each clock pulse. A flip-flop having the above characteristics is referred to as being T-type. The design of T-type flip-flops is well known to those skilled in the art of logic circuits.

The flip-flops of the counter circuit are interconnected via an enable logic circuit 1006 which provides the signals to the E inputs of all the flip-flops except the first one which is always enabled to toggle. The signal for the E input of a selected flip-flop is provided by the output of a NOR gate which is associated with that flip-flop. The associated NOR gate receives as inputs the signals from the $\overline{Q}$ outputs of all preceding flip-flop in the chain. The associated NOR gate provides the logic "1" signal to enable the associated flip-flop when the $\overline{Q}$ outputs of all the preceding flip-flops are at the logic "0" state; i.e., all the preceding flip-flops are in the logic "1" stage. The logic function of the enable logic circuit can be expressed algebraically as:

$$E_1 = \overline{Q_0};$$

$$E_2 = \overline{\overline{Q_0} + \overline{Q_1}};$$

$$E_3 = \overline{\overline{Q_0} + \overline{Q_1} + \overline{Q_2}}; \text{ and}$$

$$E_N = \overline{\sum_{i=0}^{N-1} \overline{Q_i}}.$$

To operate the circuit of FIG. 1 as a counter, each flip-flop is first set to the logic "0" state by applying a logic "1" signal to the INITIALIZE input terminal. Pulses to be counted are then applied to the CLOCK input terminal, and the binary number represented by the combined Q outputs of all the flip-flops taken according to their order of significance is equal to the number of pulses counted. The circuit counts up to a maximum of $2^N$ before resetting itself to zero.

The circuit of FIG. 1 can also be used as a clock rate divider. When a periodic sequence of clock pulses occurring at some fixed rate is applied to the CLOCK input, the $Q_0$ output of the first stage provides pulses at a rate which is equal to the clock rate divided by two, the $Q_1$ output of the second stage provides pulses at the clock rate divided by four, and the $Q_N$ output of the Nth stage provides pulses at the clock rate divided by $2^N$. Thus, a clock rate divider which divides by two taken to some integral power is achieved by taking the output from an appropriate stage. A known technique of making the clock rate divisor programmable is to include an output decoding network (not shown) which receives a set of control signals and provides the output of a stage specified by the control signals.

The prior art circuit of FIG. 1 has disadvantages in that the fan-in of the NOR gate 1007 through 1010 associated with each flip-flop stage increases with the order of the stage and the fan-outs of the flip-flops at the beginning of the flip-flop chain increase with the number of stages in the counter. For example, the NOR gate associated with the Nth stage has N inputs and the $\overline{Q}$ output of the first flip-flop in a chain of N flip-flops is N-1. In general, the pulse propagation delay through a logic gate increases with the fan-in of the gate and the maximum toggling rate of a flip-flop decreases with the fan-out of the flip-flop. Therefore, the maximum clock rate of the prior art counter circuit decreases with increasing number of stages in the counter.

Moreover, owing to the large number of transistors needed to implement the high fan-in gates and the numerous circuit interconnections created by the high fan-out flip-flops, the prior art circuit does not facilitate a compact layout when used in an integrated circuit. In general, a significant portion of the layout area of a typical prior art parallel carry synchronous counter circuit will be occupied by the enable logic circuit.

Figure 2:
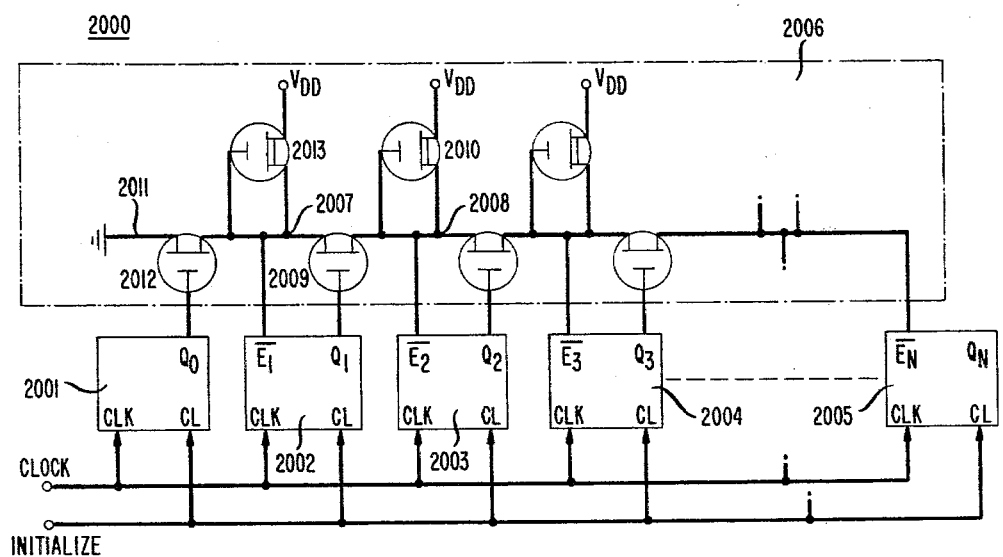
FIG. 2 is a schematic diagram of a parallel carry synchronous counter circuit according to one embodiment of the present invention.

Referring now to FIG. 2, there is shown a schematic diagram of a parallel carry synchronous binary counter in accordance with an embodiment of the present invention. The counter contains a chain of T-type flip-flops 2001 through 2005 each of which except the first one 2001 can be enabled to toggle by the application of a logic "0" signal to its inverted enable input terminal $\overline{E}$. The first flip-flop 2001 is always enabled to toggle and may either have no $\overline{E}$ terminal or it may have an $\overline{E}$ terminal which is connected to ground. The design of T-type flip-flops having inverted enable inputs is well known to those skilled in the art of logic circuit design. The flip-flops are interconnected via a novel enable logic circuit 2006 having a plurality of identical carry stages each associated with a different flip-flop except the last one 2005. The enable logic circuit of FIG. 2 is similar to the well-known ripple carry generating circuit which is used in parallel adder circuits but which has heretofore not been applied to synchronous counter circuits. I have discovered that when such a carry circuit is appropriately connected to T-type flip-flops the above-described desired logic function for the enable logic circuit of a parallel carry synchronous binary counter is achieved. Furthermore, I have also discovered that the propagation time of an enable signal through such an enable logic circuit adapted to propagate a logic "0" signal is shorter than that through such an enable logic circuit adapted to propagate a logic "1" signal.

A typical carry stage of the enable logic circuit includes an input terminal 2007 connected to the E̅ terminal of its associated flip-flop 2002 and to the output terminal of the preceding carry stage, an output terminal 2008 connected to the E̅ input of a succeeding flip-flop 2003 and also to the input terminal of a succeeding carry stage, a transmission gate consisting of an FET 2009 having its conduction channel connected in series between the input and output terminals and its gate electrode connected to the Q output of the associated flip-flop 2002, and a load transistor 2010 connected as a diode between a VDD supply terminal and the output terminal 2008. The input terminal 2011 of the first carry stage is connected to ground. Transistors 2012 and 2013 of the first carry stage form an inverter which is driven by the Q output of the first flip-flop 2001 and whose output is connected to the E̅ terminal of the second flip-flop 2002 and to the input terminal 2007 of the second carry stage. The last flip-flop 2005 of the counter circuit does not require an associated carry stage although one may be added.

The counter circuit of FIG. 2 is generally capable of operating at a higher maximum clock rate than the prior art circuit of FIG. 1 owing to the absence of high fan-in logic gates and high fan-out loading on the flip-flops. In addition because the enable logic circuit 2006 requires fewer transistors to implement than that of the prior art and only a single connection between adjacent counter stages, the circuit of FIG. 2 can be integrated in a smaller chip area than the prior art counter circuits. Finally, the circuit of FIG. 2 permits a modular layout since all stages except the first and the last are identical and the layouts of the identical stages can be repeated to reduce chip design effort. In its preferred embodiment, the circuit of FIG. 2 is implemented in n-channel metal-oxide-semiconductor technology (NMOS) with the transmission gate transistor in each carry stage operating in the enhancement mode and the load transistor operating in the depletion mode and having its gate electrode connected to the output terminal of the carry stage.

Figure 3:
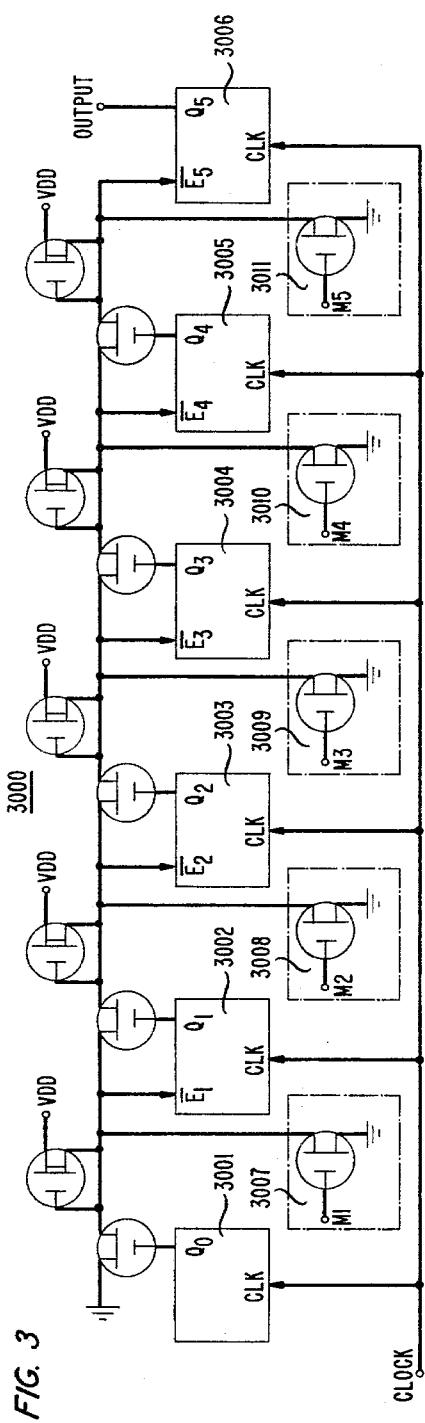
FIG. 3 is a schematic diagram of a programmable clock rate divider circuit according to another embodiment of the present invention.

Referring now to FIG. 3, there is shown a schematic diagram of a six stage clock rate divider circuit 3000 derived from the counter circuit of FIG. 2. The divider circuit contains six flip-flop stages 3001 through 3006 and provides an output signal taken from the last stage. Each carry stage of the enable logic circuit includes a programming network 3007 through 3011 which in the embodiment shown consists of a single transistor having its conduction channel coupled between the output terminal of the stage and ground. The gate electrode of the programming network transistor receives one of five control signals M1 through M5 for setting the divisor for the clock rate. When a logic "1" control signal is applied to a given stage the programming network transistor of that stage conducts pulling the output terminal of that stage to the logic "0" level thus forcing the succeeding stage flip-flop to toggle as if it were the first flip-flop of the chain. The succeeding stage flip-flop is forced to toggle for as long as the control signal remains at the logic "1" level. Thus the divisor for the clock rate is determined by the last flip-flop in the chain to be forced to toggle by the control signals. For example if M5 were at the logic "0" level and M4 were at the logic "1" level, then regardless of the logic levels of M1 through M3, the last flip-flop to be forced to toggle would be the fifth one 3005 and the clock rate divisor would be 4 ($2^2$) since the counter chain effectively begins with the fifth flip-flops. The relationship between the clock rate divisors and the control signals for the circuit of FIG. 3 is given by the following table:

| Clock Rate Divisor | M1 | M2 | M3 | M4 | M5 |
| --- | --- | --- | --- | --- | --- |
| 64 | "0" | "0" | "0" | "0" | "0" |
| 32 | "1" | "0" | "0" | "0" | "0" |
| 16 | Don't Care | "1" | "0" | "0" | "0" |
| 8 | Don't Care | Don't Care | "1" | "0" | "0" |
| 4 | Don't Care | Don't Care | Don't Care | "1" | "0" |
| 2 | Don't Care | Don't Care | Don't Care | Don't Care | "1" |

The "Don't Care" condition for a control signal means that the control signal may be either at the logic "0" or the logic "1" level.

The programming network may also include provisions for decoding the control signals in order to reduce the number of control signals required for setting the clock rate divisor. Because the divisor is determined by the last flip-flop in the chain to be forced to toggle, only a few additional transistors are needed to provide the necessary decoding function.

Figure 4:
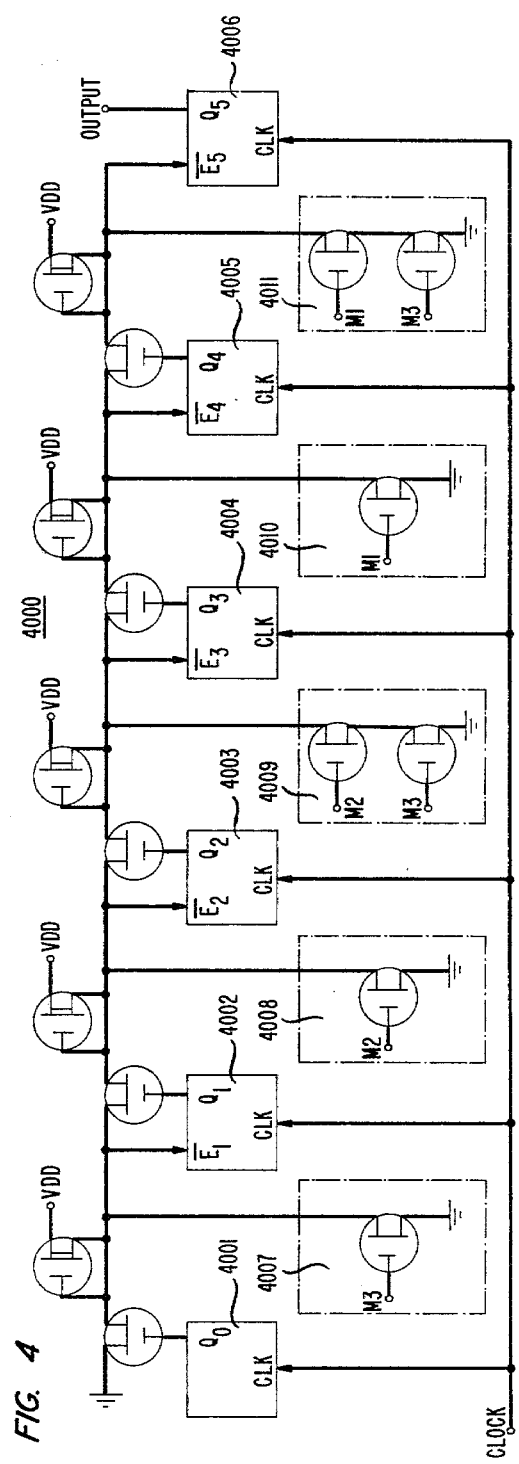
FIG. 4 is a schematic diagram of a programmable clock rate divider circuit according to still another embodiment of the present invention.

Referring now to FIG. 4, there is shown a schematic diagram of a six stage programmable clock rate divider circuit 400 in which six clock rate divisors are selected with three control signals M1, M2, and M3. The programming networks 4009 and 4011 of the third and fifth stages respectively, each consists of two transistors having their conduction channels connected in series while those of the first 4007, second 4008, and fourth 4010 stages each consists of a single transistor. The relationship between the clock rate divisors and the control signals for the circuit of FIG. 4 is given by the following table:

| Clock Rate Divisor | M1 | M2 | M3 |
| --- | --- | --- | --- |
| 64 | "0" | "0" | "0" |
| 32 | "0" | "0" | "1" |
| 16 | "0" | "1" | "0" |
| 8 | "0" | "1" | "1" |
| 4 | "1" | Don't Care | "0" |
| 2 | "1" | Don't Care | "1" |

The clock rate divider circuits of FIGS. 3 and 4 have all the advantages of high maximum clock rate, compact and modular layout discussed above in connection with the counter circuit of FIG. 2. In addition, the output decoder circuit required by prior art programmable rate divider circuit has been eliminated.

It will be appreciated that other types of flip-flops may be used in place of the T-type flip-flops in the circuits of FIGS. 2, 3, and 4. For example, flip-flops of the J-K type having J̅ and K̅ inputs may be substituted, in which case the J̅ and K̅ inputs connected together would serve as the equivalent of the E̅ input of a T-type flip-flop.

Although the described embodiments of the present invention are all up-counter circuits, the present invention is equally applicable to down-counter circuits. Each of the circuits shown in FIGS. 2, 3, and 4 may be converted to a down-counter by connecting each carry stage of the enable logic circuit to the $\overline{Q}$ output of its associated flip-flop instead of to the Q output as depicted. In some cases it may be desired to include switching means between each carry stage and its associated flip-flop to permit the counter to be selectively convertible to count in either direction.

In some applications, it may be preferable to provide each carry stage with an enhancement mode load transistor having its gate electrode connected to the VDD supply terminal instead of the depletion mode load transistor of the described embodiments. In other instances it may be preferable to provide each carry stage with a dynamic load consisting of an enhancement mode transistor having its conduction channel connected between the output terminal and the VDD supply terminal and its gate electrode connected to receive a precharge clock signal.

It will be understood by those skilled in the art that the foregoing and other modifications and changes may be made to the described embodiments without departing from the spirit and scope of the invention. For example, circuits embodying the invention may also be implemented in other field effect transistor technologies such as p-channel metal-oxide-semiconductor (PMOS) technology or complementary metal-oxide-semiconductors (CMOS) technology. In the case of CMOS technology, the transmission gate in each carry stage may comprise both a p-channel and an n-channel transistor having their conduction channels connected in parallel, the gate electrode of the n-channel transistor being connected to the Q output and the gate of the p-channel transistor being connected to the $\overline{Q}$ output of the associated flip-flop.

I claim:

1. A synchronous counter/divider circuit comprising a plurality of ordered flip-flop stages including a first, second and last stage, each flip-flop stage having output means for providing an output signal representing the logic state of the flip-flop stage and clock input means for receiving clock pulses, each flip-flop stage except the first one having enable means and being enabled to toggle when an enable signal at a logic "0" level is applied to the enable means, the first flip-flop stage being adapted to toggle;
   means for applying a sequence of clock pulses to the clock input means of each flip-flop stage; and
   logic means responsive to the output signal from each flip-flop stage for providing an enable signal to the enable means of selected ones of the flip-flop stages according to a predetermined logic function, characterized in that the logic means comprises a plurality of carry stages, a different one associated with each of the flip-flop stages except the last one, each carry stage except the one associated with the first flip-flop stage comprising:
   an input terminal;
   an output terminal;
   load means coupled between the output terminal and a first terminal adapted to be coupled to a first source providing a potential at a logic "1" level; and
   transmission gate means consisting of a field effect transistor of a first channel conductivity type having a conduction channel coupled in series between the input terminal and the output terminal and a gate electrode coupled to the output means of the associated flip-flop stage, the field effect transistor being responsive to a logic "1" level at the gate electrode for providing a relatively low resistance path across the conduction channel, the input terminal of each carry stage except the one associated with the first flip-flop stage being coupled to the enable means of the associated flip-flop stage, the input terminal of the carry stage associated with the first flip-flop stage being coupled to a second terminal adapted to be coupled to a second source providing a potential at logic "0" level, the output terminal of each carry stage being coupled to the enable means of the succeeding flip-flop stage, and whereby each carry stage is responsive to a logic "1" level output signal from the associated flip-flop stage for passing a logic "0" level enable signal to the enable means of the succeeding flip-flop stage.

2. A synchronous counter/divider circuit comprising a plurality of ordered flip-flop stages including a first, second and last stage, each flip-flop stage having output means for providing an output signal representing the logic state of the flip-flop stage and clock input means for receiving clock pulses, each flip-flop stage except the first one having enable means and being enabled to toggle when an enable signal at a first logic level is applied to the enable means, the first flip-flop stage being adapted to toggle;
   means for applying a sequence of clock pulses to the clock input means of each flip-flop stage; and
   logic means responsive to the output signal from each flip-flop stage for providing an enable signal to the enable means of selected ones of the flip-flop stages according to a predetermined logic function characterized in that the logic means comprises a plurality of carry stages, a different one associated with each of the flip-flop stages except the last one, each carry stage except the one associated with the first flip-flop stage comprising:
   an input terminal coupled to the enable means of the associated flip-flop stage;
   an output terminal coupled to the enable means of the succeeding flip-flop stage;
   load means coupled between the output terminal and a first terminal, the first terminal being adapted to be coupled to a first source of potential; and
   transmission gate means having a conduction path coupled in series between the input terminal and the output terminal and a control terminal for controlling the resistance of the path and coupled to the output means of the associated flip-flop stage, the carry stage associated with the first flip-flop stage comprising means for providing the output signal from the first flip-flop stage to the enable means of the second flip-flop stage and one or more of the carry stages except the one associated with the first flip-flop stage includes first logic means coupled to the output terminal of the carry stage and responsive to one or more control signals for providing the first logic level at the output terminal.

3. A synchronous counter/divider circuit comprising a plurality of ordered flip-flop stages including a first, second and last stage, each flip-flop stage having output means for providing an output signal representing the logic state of the flip-flop stage and clock input means for receiving clock pulses, each flip-flop stage except the first one having enable means and being enabled to toggle when an enable signal at a first logic level is applied to the enable means, the first flip-flop stage being adapted to toggle;

means for applying a sequence of clock pulses to the clock input means of each flip-flop stage; and logic means responsive to the output signal from each flip-flop stage for providing an enable signal to the enable means of selected ones of the flip-flop stages according to a predetermined logic function, characterized in that the logic means comprises a plurality of carry stages, a different one associated with each of the flip-flop stages except the last one, each carry stage except the one associated with the first flip-flop stage comprising:

an input terminal coupled to the enable means of the associated flip-flop stage;

an output terminal coupled to the enable means of the succeeding flip-flop stage;

load means coupled between the output terminal and a first terminal, the first terminal being adapted to be coupled to a first source of potential; and transmission gate means having a conduction path coupled in series between the input terminal and the output terminal and a control terminal for controlling the resistance of the path and coupled to the output means of the associated flip-flop stage, the carry stage associated with the first flip-flop stage comprising means for providing the complemented output signal from the first flip-flop stage to the enable means of the second flip-flop stage, and one or more of the carry stages except the one associated with the first flip-flop stage includes first logic means coupled to the output terminal of the carry stage and responsive to one or more control signals for providing the first logic level at the output terminal.

4. A synchronous counter/divider circuit as recited in claim 2 or 3 wherein each flip-flop stage comprises a T-type flip-flop having an output node for providing the output signal, an enable terminal for receiving the enable signal and a clock terminal for receiving the clock pulses, further characterized in that the load means comprise a first field-effect transistor of a first channel conductivity type having a conduction channel coupled between the first terminal and the output terminal, the transmission gate means comprises a second field-effect transistor of the first channel conductivity type having a conduction channel coupled in series between the input and the output terminals and a gate electrode coupled to the output node of the associated T-type flip-flop, and the first logic means comprise one or more field effect transistors each having a conduction channel coupled in series between the output terminal and a second terminal, and a control electrode coupled to receive a respective one of the control signals, the second terminal being adapted to be coupled to a second source of potential.

* * * * *